(12) United States Patent
Lin et al.

(10) Patent No.: US 11,967,613 B2
(45) Date of Patent: Apr. 23, 2024

(54) SEMICONDUCTOR STRUCTURE

(71) Applicant: WIN SEMICONDUCTORS CORP., Taoyuan (TW)

(72) Inventors: Ju-Hsien Lin, Taoyuan (TW);
Jung-Tao Chung, Taoyuan (TW);
Shu-Hsiao Tsai, Taoyuan (TW);
Hsi-Tsung Lin, Taoyuan (TW);
Chen-An Hsieh, Taoyuan (TW);
Yi-Han Chen, Taoyuan (TW);
Yao-Ting Shao, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 0 days.

(21) Appl. No.: 18/318,208

(22) Filed: May 16, 2023

(65) Prior Publication Data
US 2023/0282697 A1 Sep. 7, 2023

Related U.S. Application Data

(62) Division of application No. 17/146,936, filed on Jan. 12, 2021, now Pat. No. 11,695,037.

(51) Int. Cl.
*H01L 29/06* (2006.01)
*H01L 27/06* (2006.01)
*H01L 29/417* (2006.01)

(52) U.S. Cl.
CPC ...... *H01L 29/0649* (2013.01); *H01L 27/0635* (2013.01); *H01L 29/41775* (2013.01)

(58) Field of Classification Search
CPC ........... H01L 29/0649; H01L 29/41775; H01L 27/0635; H01L 23/3192; H01L 27/0629; H01L 23/3171; H01L 27/0605; H01L 29/42316; H01L 29/7786; H01L 21/8252; H01L 29/205; H01L 21/76879; H01L 29/408; H01L 21/764; H01L 23/53295; H01L 21/283; H01L 29/66462;
(Continued)

(56) References Cited

U.S. PATENT DOCUMENTS 7,635,606 B2    12/2009    Warren et al.
7,902,083 B2    3/2011    Bedinger et al.
(Continued)

FOREIGN PATENT DOCUMENTS

TW      201005922 A      2/2010

OTHER PUBLICATIONS

Chinese language office action dated Oct. 21, 2022, issued in application No. TW 110129037.

*Primary Examiner* — Mouloucoulaye Inoussa
(74) *Attorney, Agent, or Firm* — McClure, Qualey & Rodack, LLP

(57) ABSTRACT

A semiconductor structure includes a substrate, and an active device and a passive device over the substrate. The active device is disposed in a first region of the substrate, and the passive device is disposed in a second region of the substrate. The semiconductor structure further includes a shielding structure and a passivation layer. The shielding structure includes a barrier layer and a ceiling layer. The barrier layer is on the passive device and the active device, and the ceiling layer is on the barrier layer. The passivation layer is under the barrier layer and covers a top surface of the passive device. An air cavity is defined by sidewalls of the barrier layer, a bottom surface of the ceiling layer, and the substrate.

20 Claims, 13 Drawing Sheets

(58) Field of Classification Search
CPC ............. H01L 23/315; H01L 21/76826; H01L 21/76825; H01L 29/2003; H01L 29/7787; H01L 29/78; H01L 23/5222; H01L 21/84; H01L 23/528; H01L 21/7682; H01L 27/1203; H01L 23/5225; H01L 21/76895; H01L 23/535; H01L 23/66; H01L 2924/0002; H02M 5/458; H03F 3/19

See application file for complete search history.

(56) References Cited

U.S. PATENT DOCUMENTS

| | | |
|---|---|---|
| 8,148,830 B2 | 4/2012 | Bedinger et al. |
| 8,173,906 B2 | 5/2012 | Bedinger et al. |
| 8,313,985 B2 | 11/2012 | Hatcher, Jr. et al. |
| 8,319,112 B2 | 11/2012 | Bedinger et al. |
| 8,324,046 B2 | 12/2012 | Thei et al. |
| 8,440,012 B2 | 5/2013 | Hatcher, Jr. et al. |
| 8,492,908 B2 | 7/2013 | Siomkos et al. |
| 8,857,050 B2 | 10/2014 | Bedinger et al. |
| 9,024,324 B2 | 5/2015 | Teplik et al. |
| 9,276,101 B2 | 3/2016 | Green et al. |
| 9,508,652 B1 | 11/2016 | Herrault et al. |
| 2012/0037962 A1 | 2/2012 | Breyta et al. |
| 2013/0228790 A1 | 9/2013 | Yamamura |
| 2016/0099335 A1 | 4/2016 | Ozaki et al. |
| 2017/0330843 A1 | 11/2017 | Hua et al. |
| 2018/0277479 A1 | 9/2018 | Saka |
| 2020/0395459 A1 | 12/2020 | Singh et al. |

SEMICONDUCTOR STRUCTURE

CROSS REFERENCE TO RELATED APPLICATIONS

This application is a Divisional of Ser. No. 17/146,936, filed Jan. 12, 2021, and entitled "SEMICONDUCTOR STRUCTURE", the entirety of which is incorporated by reference herein.

BACKGROUND

Field of the Invention

The disclosure relates to a semiconductor structure, and more particularly to a semiconductor structure containing electronic devices.

Description of the Related Art

Electronic components are integrally formed on a substrate, which typically include active devices and passive devices. The active devices are different from the passive devices on various factors, such as its functions, nature of energy, ability of power gain, etc. The active devices may include diodes and transistors. The passive devices may include resistors, capacitors and inductors.

For the active devices and the passive devices on the substrate, it is necessary to provide sufficient moisture robustness to protect those devices.

Although existing moisture resistant structure on the active and passive devices of the semiconductor structure has generally been adequate for their intended purposes, they have not been entirely satisfactory in all respects, and need to be improved.

BRIEF SUMMARY OF THE INVENTION

The present disclosure provides a semiconductor structure including a substrate, and an active device and a passive device over the substrate. The active device is disposed in a first region of the substrate, and the passive device is disposed in a second region of the substrate. The semiconductor structure further includes a shielding structure and a passivation layer. The shielding structure includes a barrier layer and a ceiling layer. The barrier layer is on the passive device and the active device, and the ceiling layer is on the barrier layer. The passivation layer is under the barrier layer and covers a top surface of the passive device. An air cavity is defined by sidewalls of the barrier layer, a bottom surface of the ceiling layer, and the substrate.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
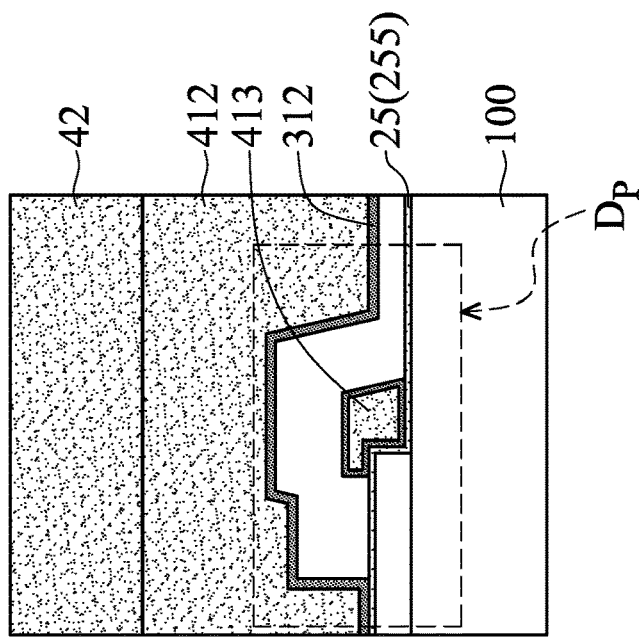
FIG. 1 is a cross-sectional view schematically illustrating a semiconductor structure in accordance with some embodiments.
Figure 1:
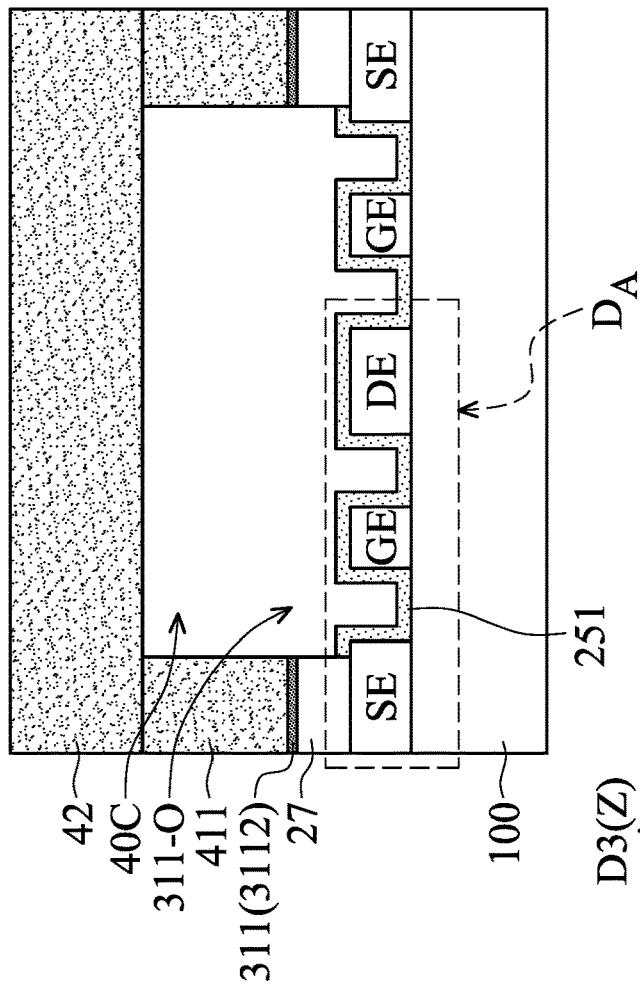

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Also, it should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

Embodiments of the present disclosure provide a semiconductor structure including a passive device and an active device formed on a substrate. A passivation layer formed on the substrate may cover the passive device and has an opening that exposes at least a portion of the active device. Therefore, the passivation layer may provide the passive device with moisture resistance without degrading the performance of the active device. In addition, a shielding structure may be formed on the passivation layer and may further prevent the active device and the passive device from degradation resulting from moisture.

FIG. 1 is a cross-sectional view schematically illustrating a semiconductor structure in accordance with some embodiments. The embodiments of the present disclosure provide a semiconductor structure containing electronic devices over a substrate 100 and a passivation layer 31 on the electronic devices. The substrate 100 may have a first region A1 and a second region A2. In some embodiments, the electronic devices include one or more active devices $D_A$ in the first region A1 and one or more passive devices $D_P$ in the second region A2. In some embodiments, the passivation layer 31 includes a portion 312 covering the passive device $D_P$ and at least one opening 311-O exposing the active device $D_A$.

According to some embodiments, the active device $D_A$ includes a gate electrode GE, a source electrode SE and a drain electrode DE on opposite sides of the gate electrode GE, and other components and/or layers required in the active device $D_A$ as selected. A dielectric layer 25 (including such as a first dielectric portion 251 and a second dielectric portion 255) can be further formed over the substrate 100, and the details would be described later. For the purpose of simplicity and clarity, some of the components and/or layers are not shown in FIG. 1. It should be noted that other types of the active device may be applicable, and the configurations of the electrodes and other components can be varied depending on the type of the to-be-formed active device in the application.

In some embodiments, the passivation layer 31 has the opening 311-O that exposes the active device $D_A$, and a portion 311 (i.e. the portion 3112 described later) of the passivation layer 31 is positioned outside the exposed area.

Therefore, there can be a reduction in the unwanted parasitic capacitance that is generated by the dielectric material located between adjacent electrodes (e.g. between the source electrode SE and the gate electrode GE, or between the gate electrode GE and the drain electrode DE) of an active device $D_A$. When the semiconductor structure of the embodiments is applied to radio frequency (RF) integrated circuits (especially when it is applied to RF integrated circuits operating at a high frequency), the electrical characteristics of the active device $D_A$ can be improved. Also, the portion 312 of the passivation layer 31 covers the passive device $D_P$ to protect the passive device $D_P$ from moisture, thus improving the reliability of the semiconductor structure of the embodiments of the present disclosure. In some embodiments, the semiconductor structure including the active device $D_A$ and the passive device $D_P$ is used as at least a portion of a power amplifier operating at a frequency in a range between 27 GHz and 40 GHz. In some embodiments, the power amplifier operates at a frequency in a range between 30 GHz and 300 GHz (e.g., in a range between 60 GHz and 90 GHz, in a range between 75 GHz and 110 GHz, or in a range between 110 GHz and 170 GHz). In some embodiments, the power amplifier operates at a frequency in a range between 1 GHz and 2 GHz.

According to some embodiments, the semiconductor structure further includes a shielding structure 40 over the substrate 100, so as to protect the electronic devices against harmful contaminants such as moisture, humidity, particulates, or ionic impurities. In some embodiments, the active device $D_A$ is enclosed by parts (such as the first barrier portion 411 functioning as a barrier wall and the ceiling layer 42) of the shielding structure 40. In some embodiments, the shielding structure 40 has an air cavity 40C over the opening 311-O of the passivation layer 31. In some embodiments, the air cavity 40C is in communication with the opening 311-O. For example, the opening 311-O of the passivation layer 31 communicating the air cavity 40C exposes the gate electrodes GE and/or the drain electrode DE of the active device $D_A$.

In some embodiments, the semiconductor structure is applied in the radio frequency (RF) integrated circuits. The active devices $D_A$ may include field effect transistors (FETs), such as gallium nitride high electron mobility transistors (GaN HEMT) and pseudomorphic high electron mobility transistor devices (pHEMTs). The active device $D_A$ may also include a bipolar junction transistor (BJT) such as a heterojunction bipolar transistor (HBT). In some embodiments, the passive devices $D_P$ include resistors, inductors, capacitors, or other suitable passive devices. In some embodiments, pHEMTs in the first region A1 and a capacitor in the second region A2 are exemplified (such as depicted in FIG. 2A to FIG. 2E and described below) for illustrating the active devices $D_A$ and the passive device $D_P$ of the semiconductor structure. It should be noted that the present disclosure is not limited to those exemplary capacitor and pHEMTs.

FIGS. 2A, 2B, 2C, 2D and 2E are cross-sectional views schematically illustrating intermediate stages of forming a semiconductor structure, in accordance with some embodiments.

Figure 2A:
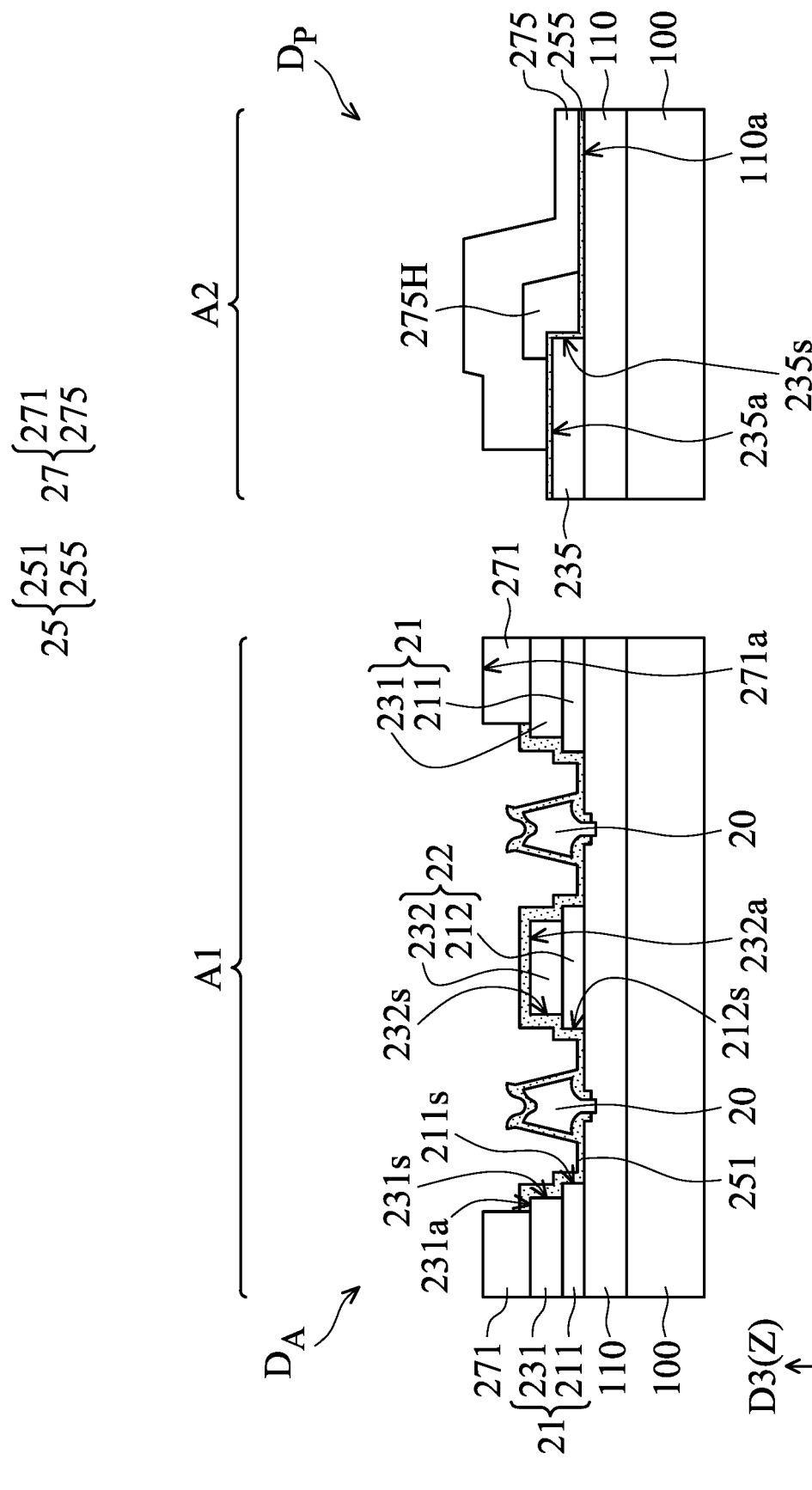
FIGS. 2A, 2B, 2C, 2D and 2E are cross-sectional views schematically illustrating intermediate stages of forming a semiconductor structure, in accordance with some embodiments.

Referring to FIG. 2A, a semiconductor structure includes a substrate 100 having the first region A1 and the second region A2. In some embodiments, the substrate 100 is a semiconductor substrate. Moreover, the substrate 100 may include III-V semiconductors such as GaN, AlGaN, AN, GaAs, AlGaAs, InP, InAlAs, InGaAs, or a combination thereof. In some embodiments, the substrate 100 includes undoped GaAs. Also, several electronic devices may be formed over the substrate 100. For example, one or more active devices $D_A$ are formed in the first region A1, and one or more passive devices $D_P$ are formed in the second region A2.

In some embodiments, the substrate 100 is a device wafer, and various films and/or device elements are formed on the substrate 100. Some films and/or device elements may not be shown in figures for the purpose of simplicity and clarity. In FIG. 2A to FIG. 2E, only a compound semiconductor epitaxial layer 110 on the substrate 100 is depicted for clarity and simplicity. The films on the substrate 100 for forming the pHEMT may include several group III-V semiconductor layers each having suitable conductivity type and doping concentration. In some embodiments, the active device $D_A$ includes the compound semiconductor epitaxial layer 110 and the electrodes formed on the compound semiconductor epitaxial layer 110.

In some embodiments, the compound semiconductor epitaxial layer 110 formed over the substrate 100 serves as a base underlying the subsequently formed electrodes of the pHEMT. The compound semiconductor epitaxial layer 110 may be a multilayer structure, and may include group III-V semiconductors such as GaN, AlGaN, AN, GaAs, AlGaAs, InP, InAlAs, InGaAs, GaSb, or a combination thereof. In some embodiments, the compound semiconductor epitaxial layer 110 includes one or more highly doped p-type GaAs layers which is doped by C, Mg, Zn, Ca, Be, Sr, Ba, and Ra. The doping concentration of the compound semiconductor epitaxial layer 110 may be in a range of between 1e18 $cm^{-3}$ to 1e20 $cm^{-3}$. The compound semiconductor epitaxial layer 110 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

In some embodiments, the compound semiconductor epitaxial layer 110 of the pHEMT includes several films epitaxially grown on the substrate 100, such as a buffer layer, a channel layer, a carrier supply layer and a Schottky barrier layer. The buffer layer is formed on the substrate 100, and the channel layer is formed on the buffer layer. The carrier supply layer is formed on the channel layer, and the Schottky barrier layer is formed on the carrier supply layer. A gate electrode formed subsequently is disposed on the Schottky barrier layer. In some embodiments, the substrate 100 includes GaAs, the buffer layer includes at least one of GaAs and AlGaAs. In some embodiments, the channel layer includes at least one of GaAs and InGaAs, and the carrier supply layer includes at least one of AlGaAs, AlGaAsP and InAlGaAs. The Schottky barrier layer is a single-layer structure or a multi-layer structure. In some embodiments, the Schottky barrier layer includes AlGaAs, AlGaAsP, InAlGaAs, InGaP, InGaPAs, AlInGaP, or a combination thereof. The figures in these exemplary embodiments only show a single-layer structure of the compound semiconductor epitaxial layer 110 for the purpose of simplicity and clarity.

In some embodiments, the pHEMT as the active device $D_A$ in the first region A1 includes at least a portion of the compound semiconductor epitaxial layer 110, a gate electrode 20 on the compound semiconductor epitaxial layer 110, a source structure 21 and a drain structure 22 on opposite sides of the gate electrode 20. The number of the gate electrodes 20, the drain structure 22 and the source structures 21 as shown in FIG. 2A is merely an example and not intended to limit the scope of the present disclosure. Adjacent gate electrodes 20, the source structures 21 and the drain structure 22 are spaced apart from each other in the first direction D1 (such as X-direction). Also, the gate electrodes 20, the source structures 21 and the drain structure 22 may extend in the second direction D2 (such as Y-direction). The second direction D2 may be different from the first direction D1. For example, the second direction D2 is perpendicular to the first direction D1.

As shown in FIG. 2A, each of the source structures 21 includes a first capping portion 211 and a first conductive portion 231 on the first capping portion 211, and the drain structure 22 includes a second capping portion 212 and a second conductive portion 232 on the second capping portion 212, in accordance with some embodiments. The first capping portions 211 and the second capping portion 212 can be formed by a deposition process (e.g., molecular-beam epitaxy (MBE), metalorganic chemical vapor deposition (MOCVD), chemical vapor deposition (CVD), hydride vapor phase epitaxy (HVPE), another process, or a combination thereof) followed by a patterning process. In some embodiments, the first capping portions 211 and the second capping portion 212 include a group III-V semiconductor such as GaN, AlGaN, AN, GaAs, AlGaAs, InP, InAlAs, InGaAs, or a combination thereof. In some embodiments, the first capping portions 211 and the second capping portion 212 include highly doped n-type InGaAs, and may form ohmic contact with the subsequently formed conductive portions serving as source/drain electrodes.

The first conductive portions 231 of the source structures 21 and the second conductive portion 232 of the drain structure 22 may be formed by patterning the same conductive layer, such as the first conductive layer or the first metal layer. The conductive layer may include Ti, Al, Au, Pd, Pt, Cu, W, other suitable metal, its alloy, or a combination thereof. Thus, the first conductive portions 231 and the second conductive portion 232 can also be referred as source metal layers and a drain metal layer, respectively. In some embodiments, the first conductive portions 231 and the second conductive portion 232 are formed by a deposition process followed by a patterning process. The deposition process may include electroplating, sputtering, resistive heating evaporation, physical vapor deposition (PVD), chemical vapor deposition (CVD), atomic layer deposition (ALD), another suitable process, or a combination thereof. The patterning process may include a photolithography process, an etching process, another applicable process, or a combination thereof.

As shown in FIG. 2A, each of the gate electrodes 20 between the source structure 21 and the drain structure 22 is formed on the compound semiconductor epitaxial layer 110, in accordance with some embodiments. In some embodiments, the gate electrodes 20 are (but not limited to) a comb-like electrode in the top view (not shown). The gate electrodes 20 may include Ti, Al, Au, Pd, Pt, Cu, W, other suitable metal, its alloy, or a combination thereof. The processes for forming the gate electrodes 20 may be the same as, or similar to, those used to form the first conductive portions 231 and the second conductive portion 232. For the purpose of brevity, the descriptions of these processes are not repeated herein.

In this exemplary embodiment, a capacitor as the passive device $D_P$ over the substrate 100 is positioned in the second region A2. In some embodiments, as shown in FIG. 2A, the passive device $D_P$ (e.g., a capacitor) includes a first conductive part 235 on the substrate 100, a second conductive part 275 over the first conductive part 235, and a dielectric layer (such as the second dielectric portion 255 of the dielectric layer 25 described later) positioned between the first conductive part 235 and the second conductive part 275. The second conductive part 275 may be formed directly on the second dielectric portion 255 of the dielectric layer 25. In some embodiments, the passive device $D_P$ has a hole 275H between the second conductive part 275 and the second dielectric portion 255 of the dielectric layer 25. It should be noted that the passive device $D_P$ of the embodiments is not limited to the exemplary capacitor.

The semiconductor structure also includes a dielectric layer 25 conformally formed on the active devices $D_A$, in accordance with some embodiments. In some embodiments, the dielectric layer 25 covers the exposed parts of the top surface 110a of the compound semiconductor epitaxial layer 110, thereby preventing oxidation of the compound semiconductor epitaxial layer 110. In some embodiments, the dielectric layer 25 also functions as a barrier that protects the active devices $D_A$ and the passive devices $D_P$ from moisture. In some embodiments, the dielectric layer 25 includes a first dielectric portion 251 formed in the first region A1 and a second dielectric portion 255 formed in the second region A2.

The dielectric layer 25 may include $Si_3N_4$, $SiO_2$, $SiO_xN_y$, one or more other suitable dielectric materials, or a combination thereof. The dielectric layer 25 may be formed by low-pressure chemical vapor deposition (LPCVD), plasma enhanced chemical vapor deposition (PECVD), atomic layer deposition (ALD), evaporation, or other suitable methods. In some embodiment, the dielectric layer 25 has a thickness in the range of about 50 Å to about 4000 Å, more particularly about 100 Å to about 3000 Å, and more particularly about 300 Å to about 1500 Å. The thickness of the dielectric layer 25 may be adjusted to improve the performance of the semiconductor structure.

As shown in FIG. 2A, the first dielectric portion 251 of the dielectric layer 25 is directly and conformally formed on the gate electrodes 20, the source structures 21 and the drain structure 22, in accordance with some embodiments. For example, the first dielectric portion 251 may cover the outer surfaces of the gate electrodes 20, the top surface and the sidewalls of the drain structure 22, the sidewalls and parts of the top surfaces of the source structures 21. Specifically, in this exemplary embodiment, the first dielectric portion 251 covers the top surface 232a of the second conductive portion 232, the sidewall 232s of the second conductive portion 232 and the sidewall 212s of the second capping portion 212 of the drain structure 22. In addition, the first dielectric portion 251 covers parts of the top surfaces 231a of the first conductive portion 231, the sidewalls 231s of the first conductive portions 231 and the sidewalls 211s of the first capping portions 211 of the source structures 21.

As shown in FIG. 2A, the second dielectric portion 255 of the dielectric layer 25 covers the exposed surfaces of the first conductive part 235 and the top surface 110a of the compound semiconductor epitaxial layer 110 in the second region A2, in accordance with some embodiments. Specifically, in this exemplary embodiment, the second dielectric portion 255 covers the top surface 235a and the sidewall 235s of the first conductive part 235. The second dielectric portion 255 further extends to the top surface 110a of the compound semiconductor epitaxial layer 110 adjacent to the first conductive part 235.

In some embodiments, the semiconductor structure includes a second conductive layer 27 over the substrate 100. The second conductive layer 27 may include a first part 271 on the first conductive portion 231 of each of the source structures 21 in the first region A1. In some embodiments, the first parts 271 of the second conductive layer 27 directly contact the first conductive portions 231 of the source structures 21. The second conductive layer 27 may also include a second part. In this exemplary embodiment, the second part is the aforementioned second conductive part 275 over the first conductive part 235 of the passive device $D_P$.

The second conductive layer 27 may include Ti, Al, Au, Pd, Pt, Cu, W, other suitable metal, its alloy, or a combination thereof. The processes for forming the second conductive layer 27 may be the same as, or similar to, those used to form the first conductive portions 231 of the source structures 21 and the second conductive portion 232 of the drain structure 22. For the purpose of brevity, the descriptions of these processes are not repeated herein.

In some embodiments, the first conductive part 235 of the passive device $D_P$, the first conductive portions 231 of the source structures 21 and the second conductive portion 232 of the drain structure 22 can be formed by patterning the same conductive material layer. In some embodiments, the first parts 271 (of the active device $D_A$) and the second part (i.e. the second conductive part 275 of the passive device $D_P$) of the second conductive layer 27 can be formed by patterning the same conductive material layer.

Figure 2B:
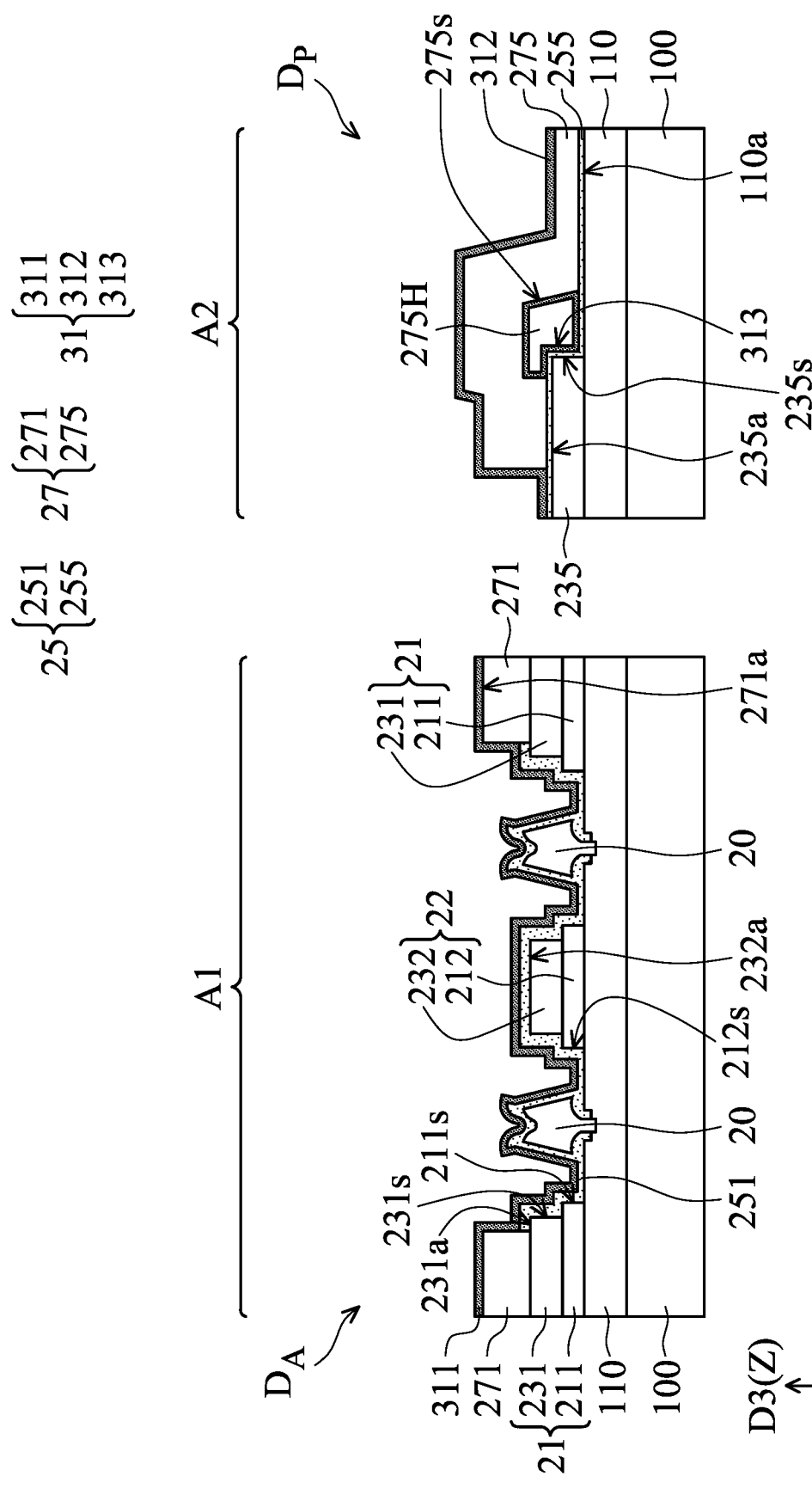

Next, referring to FIG. 2B, in some embodiments, a passivation layer 31 is formed over the substrate 100. The passivation layer 31 may be formed over the entire substrate 100 as a passivation blanket film that covers the components in the first region A1 and the second region A2. In some embodiments, the passivation layer 31 includes a first portion 311 and a second portion 312. In some embodiments, the first portion 311 is formed on the first dielectric portion 251 of the dielectric layer 25 and the first parts 271 of the second conductive layer 27. In some embodiments, the first portion 311 of the passivation layer 31 covers the gate electrodes 20, the source structures 21 and the drain structure 22 in the first region A1. In some embodiments, the second portion 312 of the passivation layer 31 covers the second conductive part 275 of the passive device $D_P$ in the second region A2.

In some embodiments, the passivation layer 31 includes $Si_3N_4$, $SiO_2$, $SiO_xN_y$, AN, $Al_2O_3$, $HfO_2$, one or more other suitable passivation materials, or a combination thereof. In some embodiments, the passivation layer 31 includes $Al_2O_3$. The passivation layer 31 may be formed by physical vapor deposition (PVD), chemical vapor deposition (CVD), atomic layer deposition (ALD), or other suitable methods. In some embodiments, the passivation layer 31 is deposited by atomic layer deposition. In some embodiments, the passivation layer 31 has a thickness in the range of about 100 Å to about 1000 Å, more particularly about 300 Å to about 1000 Å, and more particularly about 500 Å to about 750 Å.

During formation of the passivation layer 31, the passivation material can be further deposited at the sidewalls 275s of the hole 275H, in accordance with some embodiments. As shown in FIG. 2B, in some embodiments, the passivation material deposited at the sidewalls 275s of the hole 275H serves as a passivation liner 313.

Although the passivation layer 31 provides an effective environmental barrier that protects the devices from moisture, the passivation material may induce unwanted parasitic capacitance between the source/drain structure and the gate electrode, especially when the passivation layer 31 is made of the material with a high dielectric constant. Therefore, a portion of the passivation layer 31 is selectively removed to form an opening that exposes the active device $D_A$ for reducing unwanted parasitic capacitance, in accordance with some embodiments. Meanwhile, the remaining portion of the passivation layer 31 covers the passive device $D_P$ and protects it from moisture. The details will be discussed in the following paragraphs.

Figure 2C:
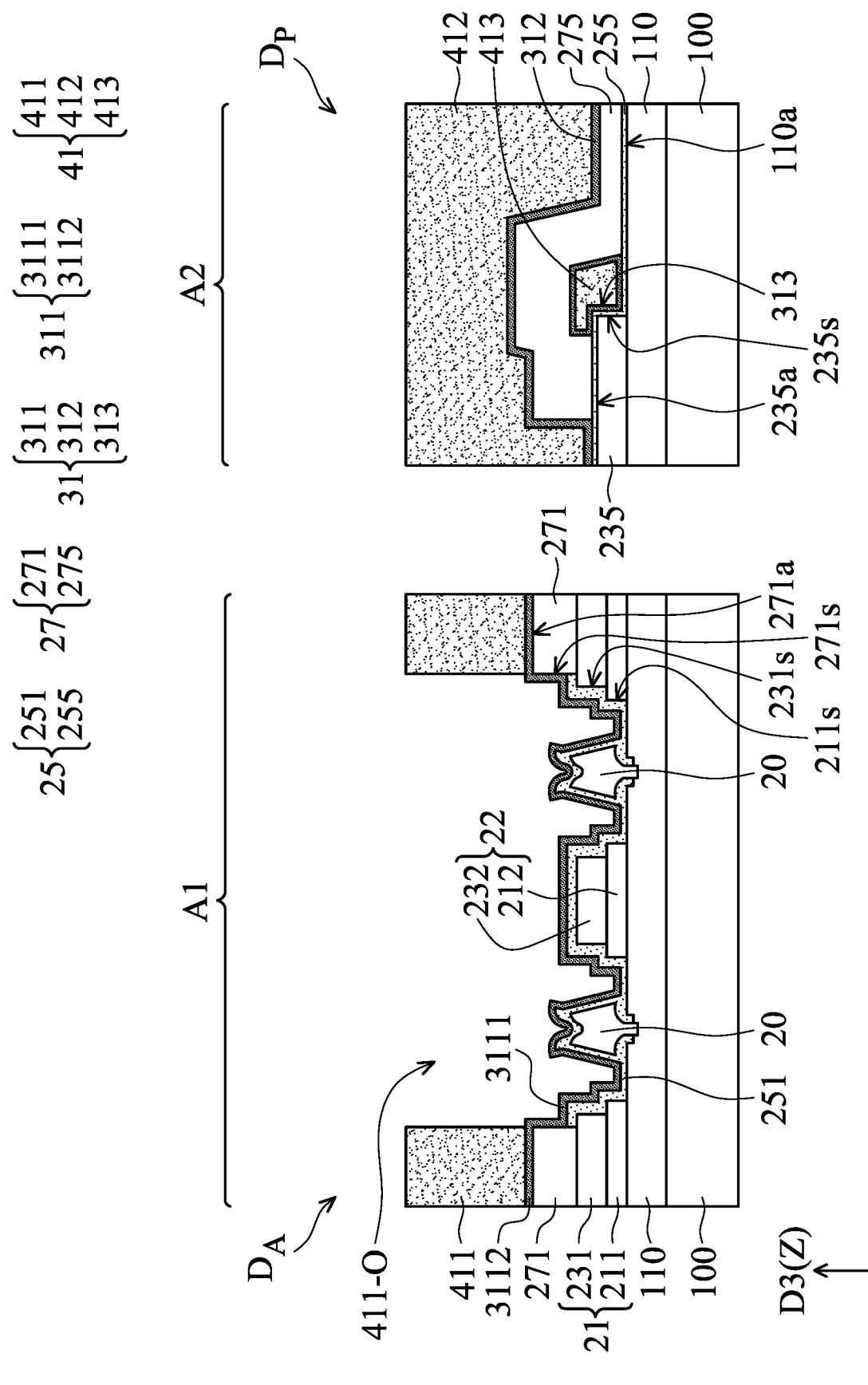
Figure 2D:
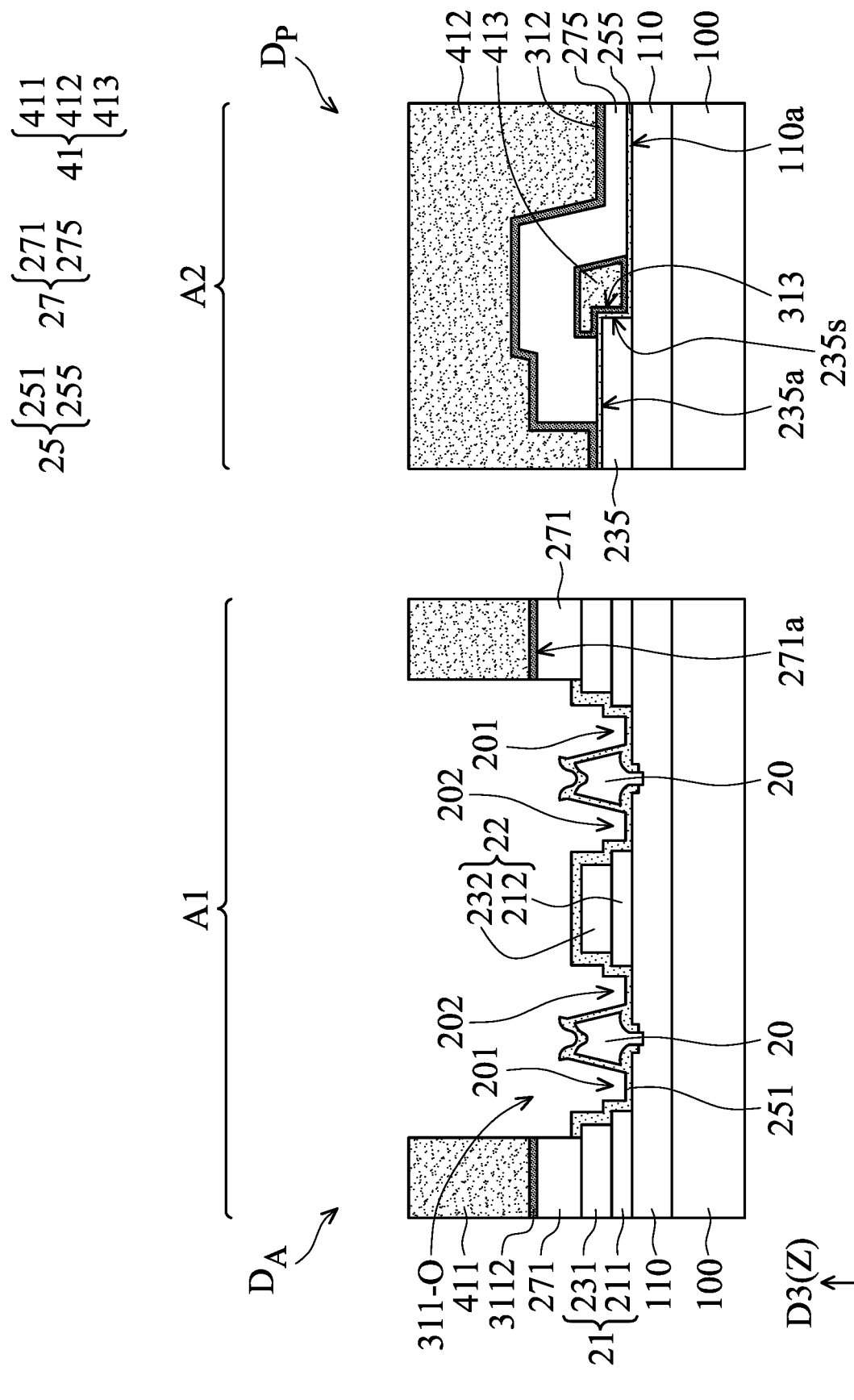
Figure 2E:
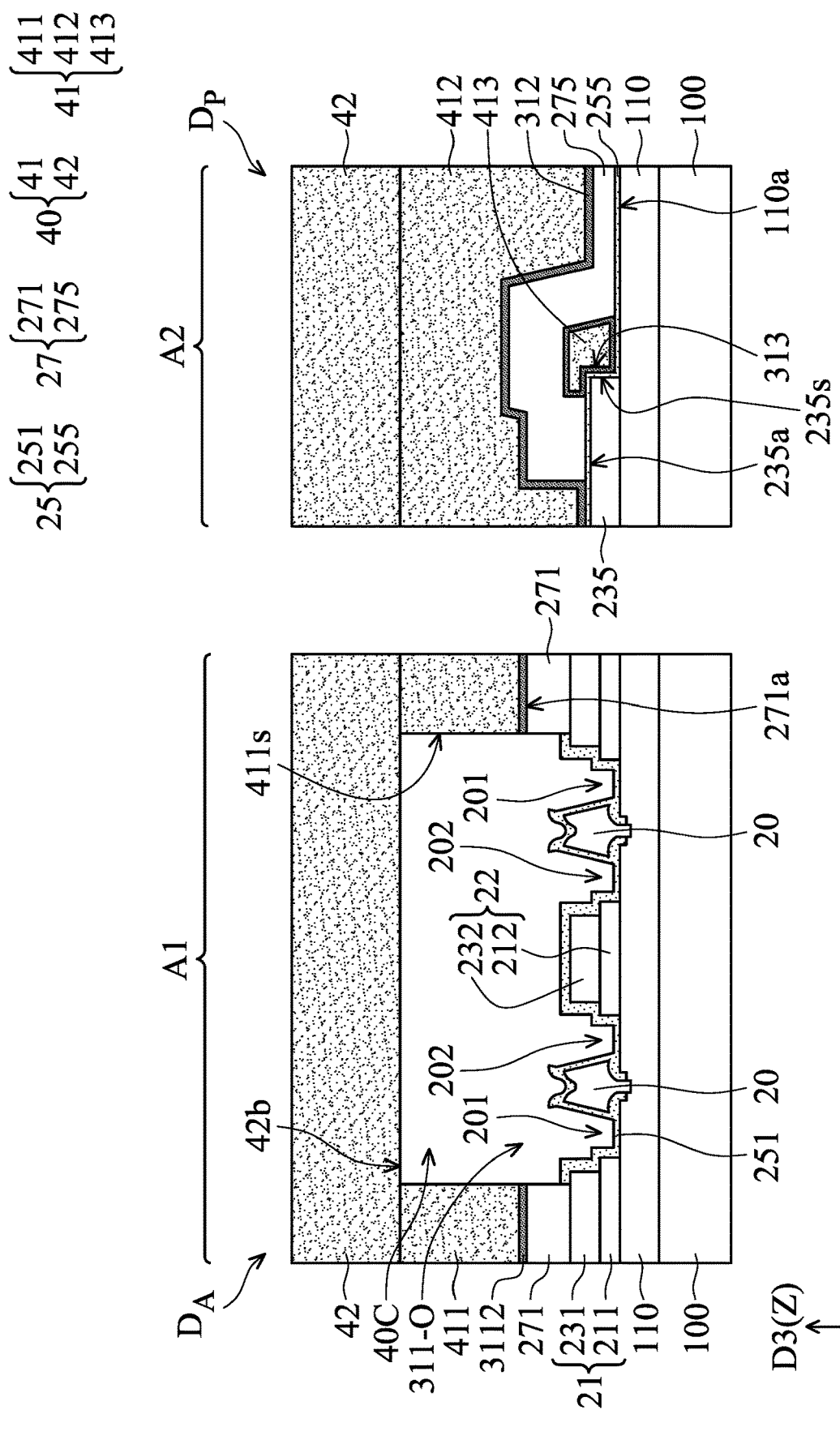

Referring to FIG. 2C and FIG. 2D, which depict the steps of selectively removing the passivation layer 31, in accordance with some embodiments. In this exemplary embodiment, a shielding structure 40 is further introduced into the semiconductor structure to protect the active device(s) $D_A$ and the passive device(s) $D_P$ from harmful contaminants, such as moisture, humidity, particulates, and/or ionic impurities. In some embodiments, the shielding structure 40 is formed using a wafer level packaging process. In some embodiments, the shielding structure 40 is formed using a dry film process. In some embodiments, the shielding structure 40 includes a barrier layer 41 and a ceiling layer 42 (FIG. 2E). Also, the passivation layer 31 can be selectively removed using a barrier portion of the barrier layer 41 as a mask.

Referring to FIG. 2C, in some embodiments, a barrier layer 41 includes a first barrier portion 411 in the first region A1 and a second barrier portion 412 in the second region A2. The barrier layer 41 may be formed by providing a barrier material layer on the passivation layer 31, followed by patterning the barrier material layer. After the barrier material layer is patterned, the remaining portions of the barrier material layer are referred to as the first barrier portion 411 in the first region A1 and the second barrier portion 412 in the second region A2. In some embodiments, the first barrier portion 411 in the first region A1 is formed above the source structure 21 to serve as a barrier wall, and the second barrier portion 412 covers the passive device $D_P$ in the second region A2, in accordance with some embodiments. The barrier wall may surround the gate electrodes 20 and the drain structure 22 in the top view (not shown). As shown in FIG. 2C, the first barrier portion 411 in the first region A1 defines an opening 411-O that exposes the portion of the passivation layer 31 that covers the gate electrodes 20 and the drain structure 22. In some embodiments, the opening 411-O also exposes another portion of the passivation layer 31 which covers the sidewalls 271s of the first parts 271 of the second conductive layer 27, the sidewalls 231s of the first conductive portions 231 and the sidewall 211s of the first capping portions 211 of the source structures 21.

As shown in FIG. 2C, in some embodiments, the barrier layer 41 further includes a third barrier portion 413 in the second region A2. As described above, the passive device $D_P$ may have a hole 275H between the second conductive part 275 and the substrate 100, and the passivation liner 313 can be formed at the sidewall 275s of the hole 275H (FIG. 2B). In some embodiments, during formation of the barrier layer 41, the barrier material in the second region A2 also fills the hole 275H, thereby forming the third barrier portion 413. The third barrier portion 413 may be separated from the first conductive part 235 and the second conductive part 275 by the passivation liner 313.

In some embodiments, the barrier layer 41 and the passivation layer 31 include different materials. The material of the barrier layer 41 may have lower moisture permeability than that of the material of the passivation layer 31. For example, the barrier layer 41 is made of a material having a first water vapor transmission rate (WVTR), the passivation layer 31 is made of another material having a second water vapor transmission rate, and the first water vapor transmission rate is less than the second water vapor transmission rate.

The barrier layer 41 may include one or more organic materials, such as a polymer material. In one exemplary embodiment, the barrier layer 41 includes a photoresist material. Material examples of the barrier layer 41 include polydimethylsiloxane (PDMS), SU8 (i.e. an epoxy material from MicroChem Inc.®), CYTOP® (from Asahi Glass Company), DuPont® WPR® (wafer photoresist), and another appropriate material. Also, a barrier material layer may be formed over the substrate 100 by spin coating, spray coating, thermal vapor deposition (TVD) or any other suitable method, followed by patterning the barrier material layer to form the barrier layer 41. In some embodiments, the barrier layer 41 is formed using a dry film process.

In one example, the barrier material layer is made of, but not limited to, the epoxy based, photo sensitive polymer SU8, and then SU8 is patterned by a lithography process to form the barrier layer 41. SU8 is a photoresist that has good mechanical durability, water impermeability and dielectric properties on polymerization, and can easily be patterned to obtain the portions with high aspect ratios. Thus, in some embodiments, SU8 can be used as the material to form the first barrier portion 411 of the barrier layer 41 with a high aspect ratio, thereby creating an air cavity 40C (FIG. 2E) having a sufficient height in the third direction D3 (e.g. Z-direction).

Referring to FIG. 2D, in some embodiments, a portion of the passivation layer 31 (such as the portion 3111 in FIG. 2C) is selectively removed to form an opening 311-O exposing the active device $D_A$, while the remaining portion of the passivation layer 31 still covers the passive device $D_P$. In some embodiments, after the selective removal of the passivation layer 31 is performed, a portion 3112 of the passivation layer 31 remains on the first parts 271 of the second conductive layer 27 in the first region A1, and the second portion 312 and the passivation liner 313 remain on the surface of the passive device $D_P$ in the second region A2.

According to the embodiments of the present disclosure, the passivation layer 31 can be selectively removed using the barrier layer 41 as a mask. As shown in FIG. 2C and FIG. 2D, the first barrier portions 411 of the barrier layer 41 corresponding to the active devices $D_A$ in the first region A1 are provided as a mask for pattering the underlying passivation layer 31. In some embodiments, the passivation layer 31 can be etched through the hole(s) in the barrier layer 41 to form the opening 311-O of the passivation layer 31. Therefore, no extra mask is required for pattering the passivation layer 31, in accordance with some embodiments.

Referring to FIG. 2D, in some embodiments, only the first dielectric portion 251 of the dielectric layer 25 and the air gap 201 exist between the source structure 21 and the gate electrode 20 in the first direction D1 (such as X-direction). Similarly, only the first dielectric portion 251 of the dielectric layer 25 and the air gap 202 exist between the drain structure 22 and the gate electrode 20 in the first direction D1 (such as X-direction). Accordingly, compared to a typical active device that included a metal-insulator-metal lamination (e.g. formed by the source/drain electrodes and several dielectric and/or organic layers), there can be much less unwanted parasitic capacitance in the active device $D_A$ of the embodiments.

Next, referring to FIG. 2E, a ceiling layer 42 is formed on the barrier layer 41, thereby forming a shielding structure 40. The ceiling layer 42 may directly contact the barrier layer 41. The materials and processes for forming the ceiling layer 42 may be the same as, or similar to, those used for forming the barrier layer 41. For the purpose of brevity, the descriptions of the materials and processes of the ceiling layer 42 are not repeated herein.

In some embodiments, the barrier layer 41 and the ceiling layer 42 form an air cavity 40C over the opening 311-O of the passivation layer 31. In some embodiments, the air cavity 40C is defined by sidewalls 411s of the first barrier portion 411 of the barrier layer 41 and the bottom surface 42b of the ceiling layer 42. In some embodiments, the air cavity 40C defined by the shielding structure 40 is in communication with the opening 311-O of the passivation layer 31 in the first region A1.

In some embodiments, the ceiling layer 42 is suspended on the first barrier portion 411 (as the barrier wall) of the barrier layer 41, and configured as a roof of the shielding structure 40. As shown in FIG. 2E, the first barrier portion 411 of the barrier layer 41 is formed directly on the portion 3112 of the passivation layer 31 in the first region A1, in accordance with some embodiments. In some embodiments, a combination of the portion 3112 of the passivation layer 31, the first barrier portion 411 of the barrier layer 41 and the ceiling layer 42 encloses the active devices $D_A$, and thus further protects the active devices $D_A$ against harmful contaminants such as moisture, humidity, particulates, or ionic impurities.

Although the barrier wall (i.e. the first barrier portion 411 of the barrier layer 41) of the shielding structure 40 shown in FIG. 2E is positioned above the two closest source structures 21 of two active devices $D_A$, the present disclosure is not limited to this configuration. In some other embodiments, the barrier wall of the shielding structure 40 is positioned to enclose three or more active devices $D_A$ by forming the barrier wall on two outermost source structures 21 of the active devices $D_A$. Position of the barrier wall of the shielding structure 40 can be determined according to the design conditions of the application, such as the dimensions of the source structures 21, the drain structure 22 and the gate electrodes 20, and the distances between the source/drain structures 21/22 and the gate electrodes 20.

Figure 3:
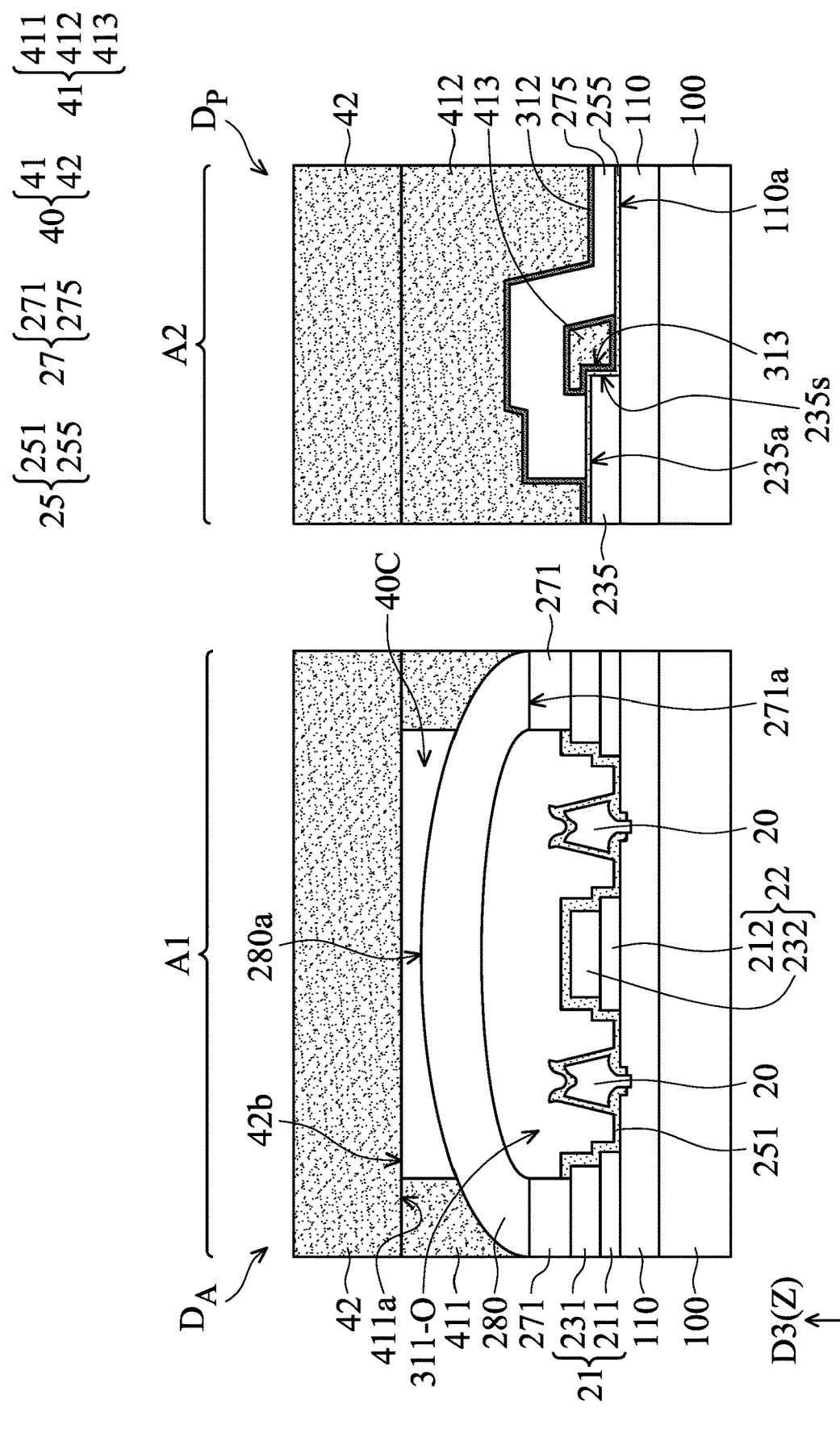
FIG. 3 is a cross-sectional view schematically illustrating a semiconductor structure in accordance with some embodiments.

The semiconductor structure may further include one or more additional components for various purposes, such as but not limited to, electrical connection of source electrodes, heat conduction, and/or structural reinforcement. FIG. 3 is a cross-sectional view schematically illustrating a semiconductor structure in accordance with some other embodiments. In one example, as shown in FIG. 3, the source structures 21 of the active devices $D_A$ over the substrate 100 are further electrically connected by a conductive bridge.

In some embodiments, the semiconductor structure further includes a conductive bridge 280 electrically connecting the source structures 21 of the active devices $D_A$. For example, the conductive bridge 280 joins the source structures 21 of the pHEMTs. In some embodiments, after the passivation layer 31 is formed as shown in FIG. 2B, the first portion 311 of the passivation layer 31 on the first parts 271 of the second conductive layer 27 is partially removed to expose parts of the top surfaces 271a of the first parts 271, and then the conductive bridge 280 is formed directly on the exposed top surfaces 271a of the first parts 271 for electrically connecting the source structures 21. Therefore, the conductive bridge 280 may directly contact the first parts 271 of the second conductive layer 27. The shielding structure 40 is then subsequently formed on the active devices $D_A$ and the passive devices $D_P$. It should be noted that the first portion 311 is not shown in FIG. 3 due to the cross-sectional position, but it covers the entire area of the top surfaces 271a of the first parts 271 under the first barrier portion 411 (e.g. the barrier wall) except for the contact areas of the conductive bridge 280 and the first parts 271, in accordance with some embodiments.

The conductive bridge 280 may include Ti, Al, Au, Pd, Pt, Cu, W, other suitable metal, its alloy, or a combination thereof. The conductive bridge 280 may be referred to as a metal bridge. The processes for forming the conductive bridge 280 may be the same as, or similar to, those used for forming the second conductive layer 27. For the purpose of brevity, the descriptions of these processes are not repeated herein.

As shown in FIG. 3, the conductive bridge 280 is confined in the air cavity 40C that is defined by the barrier layer 41 and the ceiling layer 42. The top surface 411a of the first barrier portion 411 of the barrier layer 41 can be level with or higher than the conductive bridge 280 without affecting the function of the conductive bridge 280. In some embodiments, the bottom surface 42b of the ceiling layer 42 is spaced apart from the top surface 280a of the conductive bridge 280.

As shown in FIG. 2E and FIG. 3, since a selective removal of the passivation layer 31 is performed (FIG. 2D) to expose the active device $D_A$ except the top surfaces of the source structures 21, the parasitic capacitances generated between the gate electrode 20 and the source/drain structure 21/22 can be significantly reduced. In some embodiments, the top surface of the passive device $D_P$ is covered by the remaining portion of the passivation layer (i.e. the second portion 312), thereby enhancing its moisture resistance. In some embodiments, a shielding structure 40 is further introduced to protect the active devices $D_A$ and the passive devices $D_P$ from harmful contaminants, such as moisture, humidity, particulates, and ionic impurities. Therefore, in some embodiments, although parts of the active device $D_A$ are not protected by the portion 3112 of the passivation layer 31, the reliability of the active device $D_A$ can be maintained or even be improved by the shielding structure 40.

Figure 4:
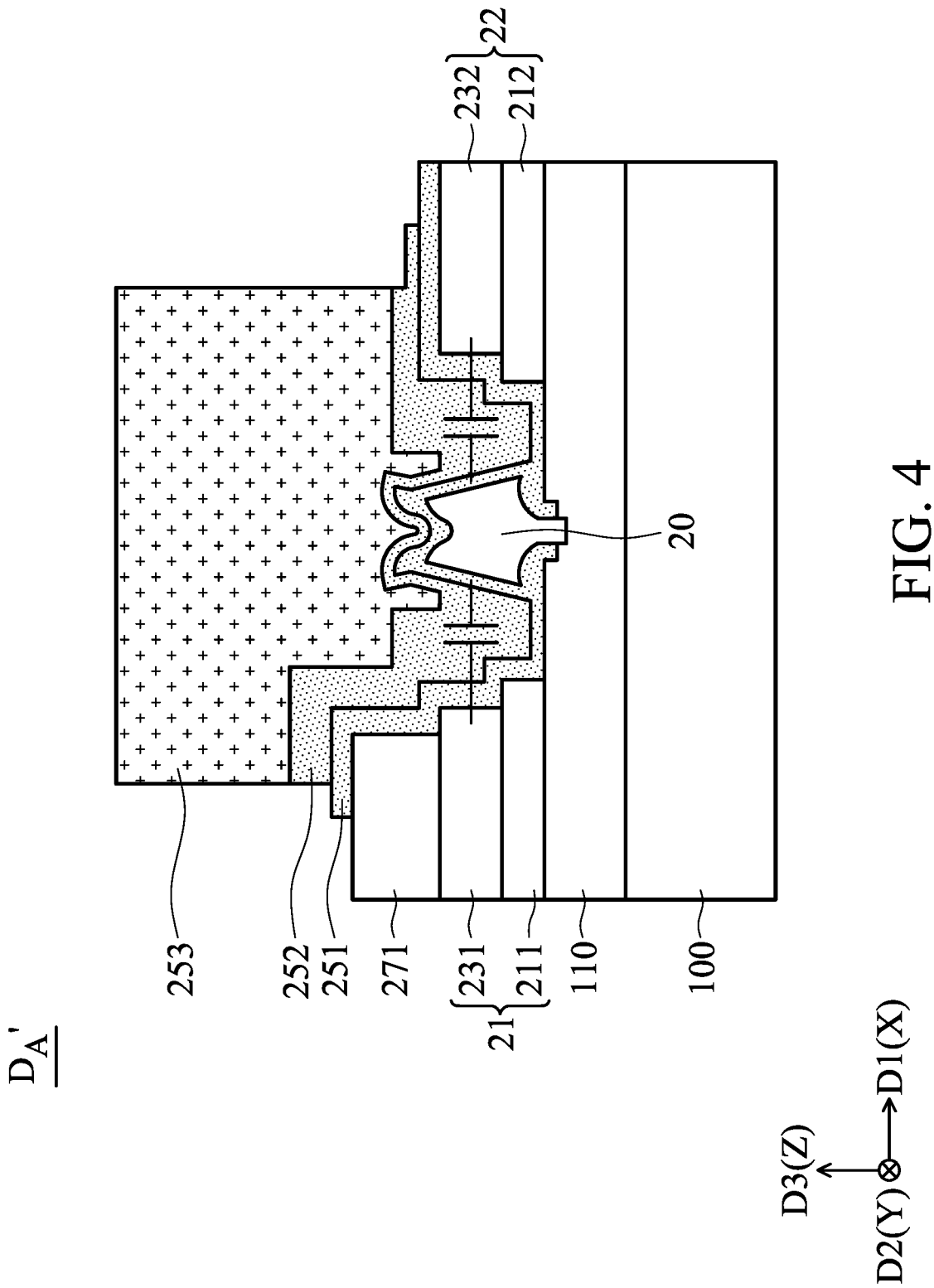
FIG. 4 is a cross-sectional view schematically illustrating an active device in accordance with a comparative example.
Figure 5:
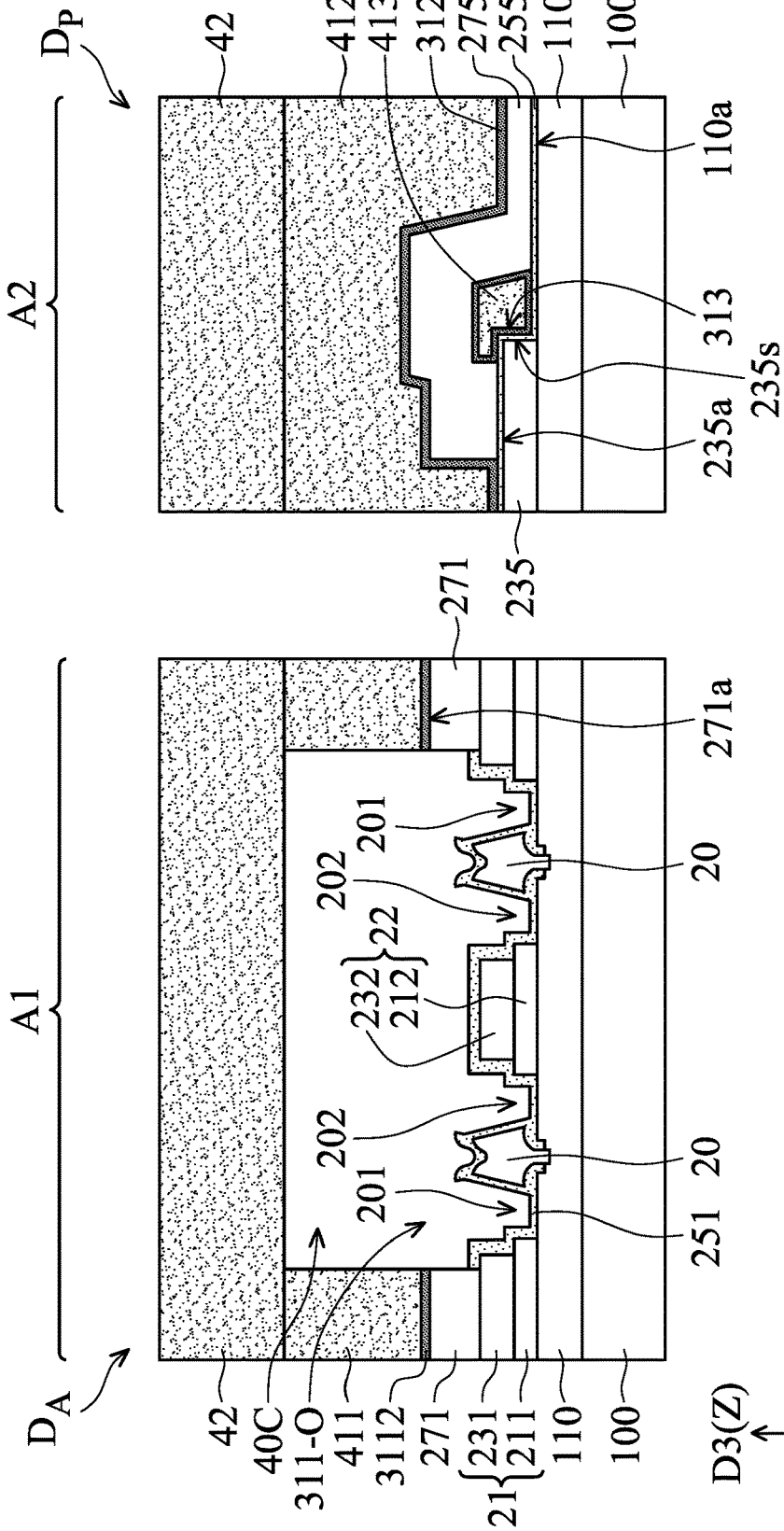
FIG. 5 is a cross-sectional view schematically illustrating an active device in accordance with one of exemplary embodiments.

Below, one comparative example and one of exemplary embodiments are provided for evaluating the electrical properties and reliabilities of its active devices. FIG. 4 is a cross-sectional view schematically illustrating an active device $D_A'$ in accordance with a comparative example. FIG. 5 is a cross-sectional view schematically illustrating an active device $D_A$ in accordance with one of exemplary embodiments. The active device $D_A$ shown in FIG. 5 is identical to the active device $D_A$ shown in FIG. 2E, and so the descriptions of the elements in FIG. 5 are not repeated herein. Also, the same or similar reference numerals or reference designators denote the same or similar components/layers in FIG. 4 and FIG. 5. For the purpose of brevity, the materials of the same or similar components/layers and processes of forming those components/layers are not repeated herein.

Referring to FIG. 4 and FIG. 5, a dielectric layer (i.e. the first dielectric portion 251 as described above) is conformally disposed on the gate electrode(s) 20, the source structure(s) 21 and the drain structure 22. The components formed over the substrate 100 in the comparative example (FIG. 4) and the exemplary embodiment (FIG. 5) so far have the identical configurations (such as dimensions and relative positions). Then, a protect nitrite ($Si_3N_4$) layer 252 and a polybenzoxazole (PBO) layer 253 are further deposited on the first dielectric portion 251 for forming the comparative active device $D_A'$ in FIG. 4. Without forming protect nitrite and PBO, a shielding structure 40 having an air cavity 40C is formed over the gate electrodes 20, the source structures 21 and the drain structure 22 for forming an embodied active device $D_A$ in FIG. 5. In this exemplary embodiment, the first barrier portion 411 of the barrier layer 41 of the shielding structure 40 is formed on the portion 3112 of the passivation layer 31, and the passivation layer 31 is made of $Al_2O_3$ and has a thickness of about 750 Å. Each of the barrier layer 41 and the ceiling layer 42 has a thickness of 20 µm. It should be noted that those dimensions of the active devices $D_A$ may be varied in different numerical values and are not limited to the exemplary embodiment set forth herein.

(1) Electrical Properties of Active Devices $D_A'$ and $D_A$

Several tests were performed on the comparative active device $D_A'$ and the embodied active device $D_A$ for analyzing the electrical properties. Results of the gate-to-drain capacitance (CGD), the gate-to-source capacitance (CGS), the cut-off frequency (ft) at the current gain equal to 1, and the maximum oscillation frequency (fmax) at the power gain equal to 1 in each of the active devices in the comparative example and the exemplary embodiment are shown in Table 1.

TABLE 1

| Parameters (average) | Comparative Example (with protect nitrite and PBO) | Exemplary Embodiment (with air cavity and the shielding structure) |
| --- | --- | --- |
| CGD | 181.8 | 95.9 |
| CGS | 1379.2 | 1236.9 |
| cut-off frequency (ft) | 84.8 | 97.5 |
| maximum oscillation frequency (fmax) | 174.3 | 227.1 |

Although the comparative active device $D_A'$ shown in FIG. 4 includes the protect nitrite ($Si_3N_4$) layer 252 and the PBO layer 253 to increase the moisture resistance ability, the dielectric constant of $Si_3N_4$ is about 7.5, and the parasitic capacitances between the gate electrode and the source/drain electrode are generated. The results in Table 1 have indicated that the CGD (i.e. 181.8) and CGS (i.e. 1379.2) values of the comparative active device $D_A'$ are greater than the CGD (gate-to-drain capacitance) and CGS (gate-to-source capacitance) values of the active device $D_A$ of the exemplary embodiment, respectively. Thus, the parasitic capacitances between the gate electrodes 20 and the source/drain electrodes of the source/drain structures 21/22 of the active device $D_A$ in accordance with the exemplary embodiment can be significantly reduced, since the gate electrodes 20 and the source/drain electrodes of the source/drain structures 21/22 are enclosed only by the first dielectric portion 251 and the air (dielectric constant of 1) in the air cavity 40C of the shielding structure 40.

Also, the results in Table 1 have indicated that the comparative active device $D_A'$ of the comparative example has a cut-off frequency (ft) of 84.8 at the current gain equal to 1, while the active device $D_A$ of the exemplary embodiment has a cut-off frequency (ft) of 97.5 at the current gain equal to 1. Compared with the cut-off frequency (ft) of the comparative active device $D_A'$, the cut-off frequency (ft) of the active device $D_A$ of the exemplary embodiment is increased by about 15%.

Also, the results in Table 1 have indicated that the active device $D_A'$ of the comparative example has the maximum oscillation frequency (fmax) of 174.3 at the power gain equal to 1, while the active device $D_A$ of the exemplary embodiment has the maximum oscillation frequency (fmax) of 227.1 at the power gain equal to 1. Compared with the maximum oscillation frequency (fmax) of the comparative active device, the maximum oscillation frequency (fmax) of the active device $D_A$ of the exemplary embodiment is significantly increased by about 30%.

Thus, the active devices $D_A$ in some embodiments do have significantly improved the electrical properties, such as reduced CGD (gate-to-drain capacitance) and CGS (gate-to-source capacitance). Also, the active devices $D_A$ having higher cut-off frequency (ft) and the maximum oscillation frequency (fmax), in accordance with some embodiments, are suitable for being applied in power amplifiers (e.g., millimeter-wave power amplifiers).

(2) Bias Highly Accelerated Temperature/Humidity Stress Test on Active Devices $D_A'$ and $D_A$ The comparative active devices $D_A'$ and the embodied active devices $D_A$ are subjected to a bias highly accelerated temperature/humidity stress test (bHAST), thereby evaluating how well the active devices resists moisture ingression.

A total of 237 samples of the comparative active devices $D_A'$ and 26 samples of the embodied active devices $D_A$ were selected for bHAST screening. The samples were mounted to a test board and biased at a Vds of 5.0 volts and a Vgs of 0 volts. The biased samples were then subjected to a temperature of 130° C. with a relative humidity of 85% and pressurized to 2.27 atm for a duration of 96 hours. The threshold voltages (Vto) and gate leakage were measured prior to screening and at the completion of the 96 hours. The failure criteria of greater than a 20% change in threshold voltages (Vto) and a current leakage Igs (current from gate-to-source) of more than 1 mA/mm at the completion of the 96 hours were determined for bHAST.

Figure 6A:
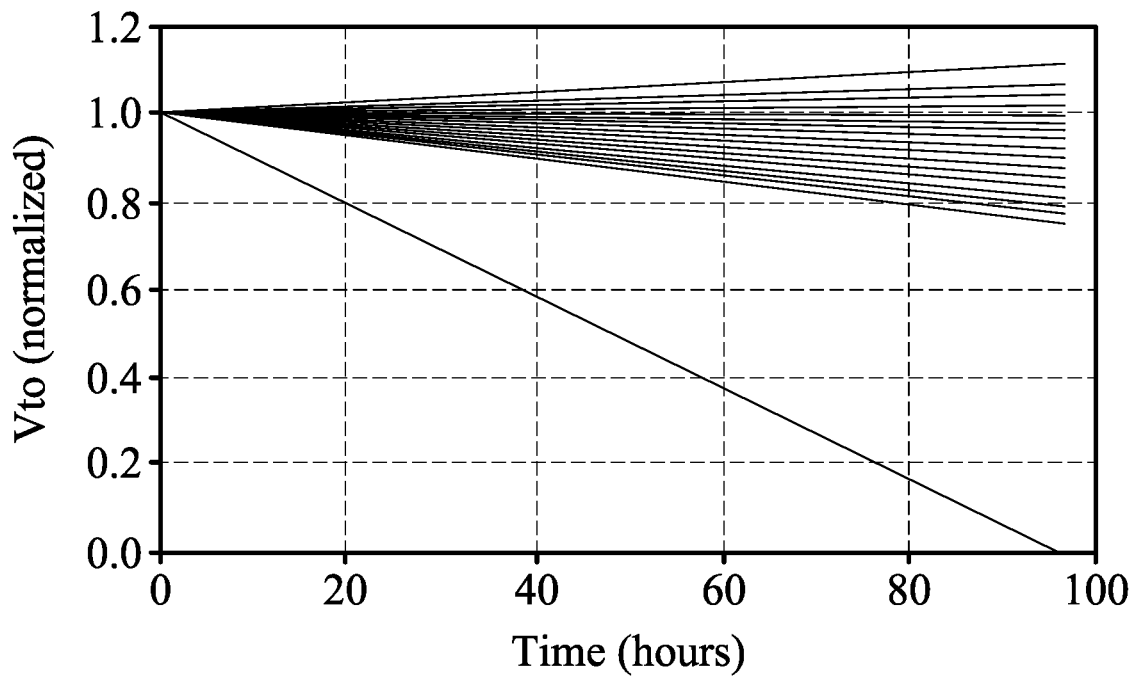
FIG. 6A shows plots of threshold voltage (normalized) versus time for the samples of the comparative active devices, at the bias highly accelerated temperature/humidity stress test.
Figure 6B:
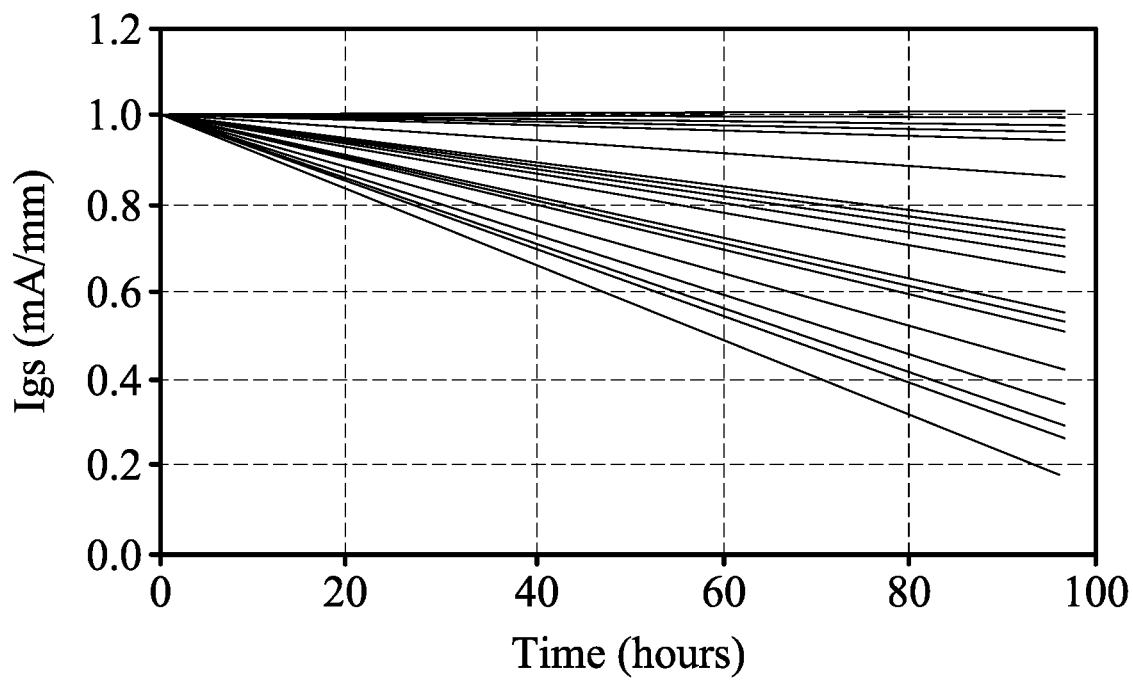
FIG. 6B shows plots of current leakage (Igs, current from gate-to-source) versus time for the samples of the comparative active devices, at the bias highly accelerated temperature/humidity stress test.

FIG. 6A shows plots of threshold voltage (normalized) versus time for the samples of the comparative active devices $D_A'$, at the bias highly accelerated temperature/humidity stress test. FIG. 6B shows plots of current leakage (mA/mm)(i.e. Igs, current from gate-to-source) versus time for the samples of the comparative active devices $D_A'$, at the bias highly accelerated temperature/humidity stress test. As shown in FIG. 6A and FIG. 6B, 105 samples in all 237 samples of the comparative active devices $D_A'$ fail to pass the bHAST at the completion of the 96 hours; that is, 44% of the samples fail to pass the criteria established above of less than 20% (<20%) variation in threshold voltage (normalized) Vto and the current leakage of less than 1 mA/mm.

Figure 7A:
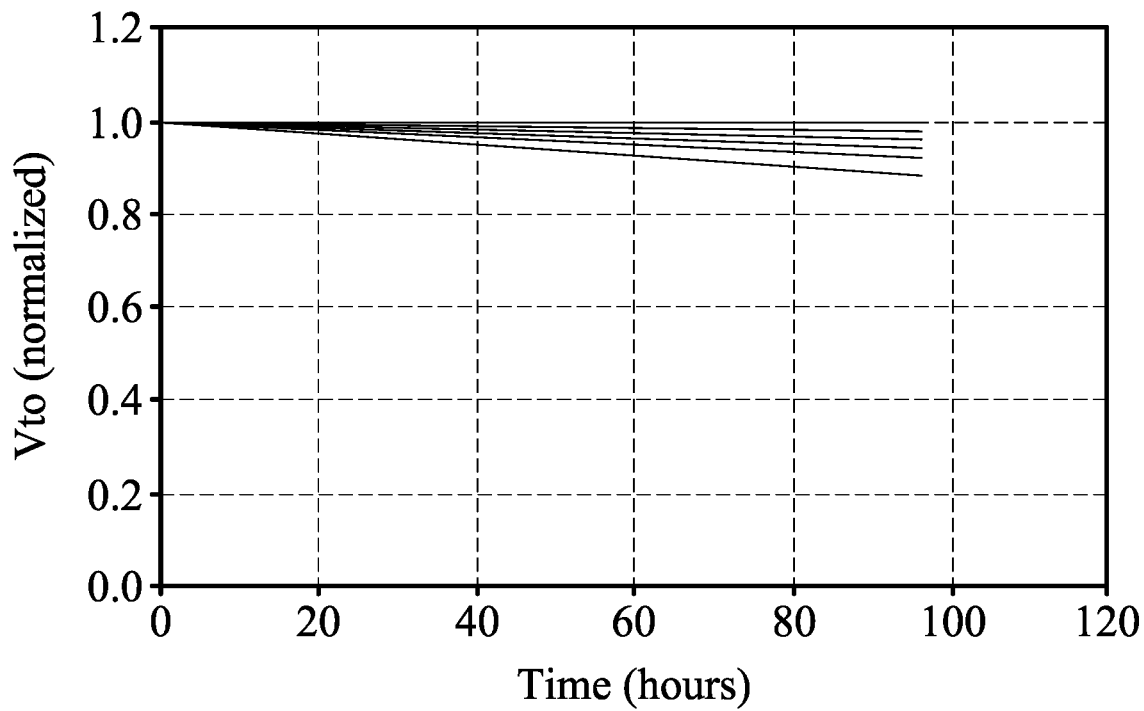
FIG. 7A shows plots of threshold voltage (normalized) versus time for the samples of the embodied active devices, at the bias highly accelerated temperature/humidity stress test.
Figure 7B:
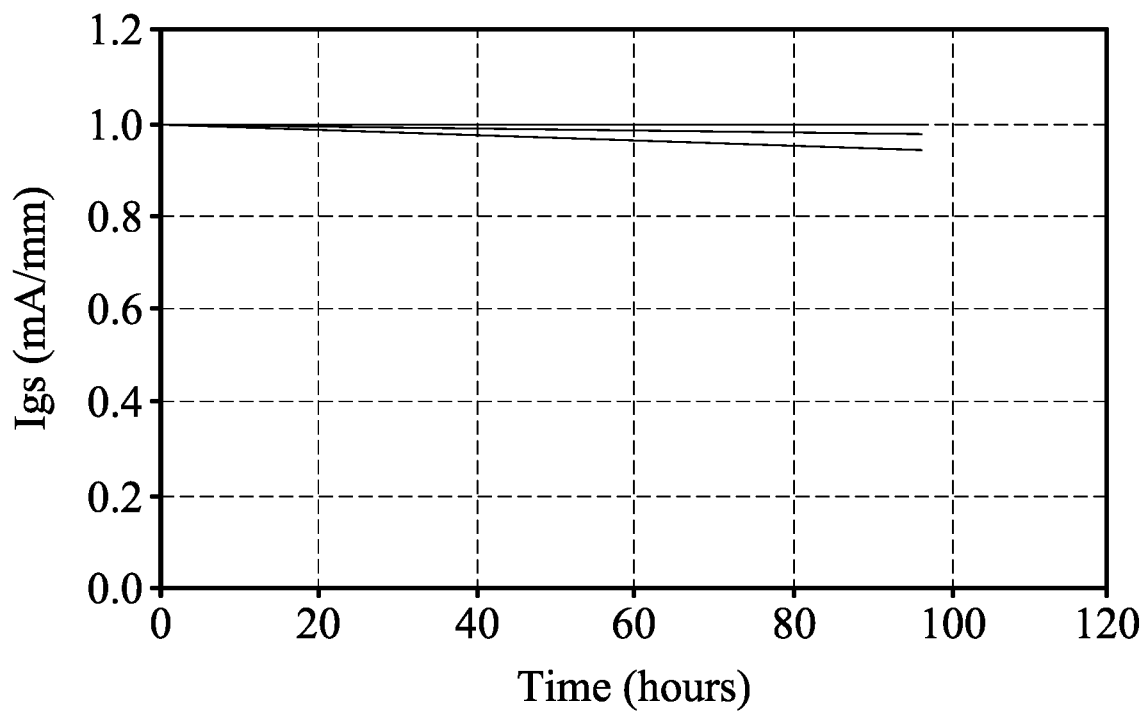
FIG. 7B shows plots of current leakage (Igs, current from gate-to-source) versus time for the samples of the embodied active devices, at the bias highly accelerated temperature/humidity stress test.

FIG. 7A shows plots of threshold voltage (normalized) versus time for the samples of the embodied active devices $D_A$, at the bias highly accelerated temperature/humidity stress test. FIG. 7B shows plots of current leakage (mA/mm)(i.e. Igs, current from gate-to-source) versus time for the samples of the embodied active devices $D_A$, at the bias highly accelerated temperature/humidity stress test. As shown in FIG. 7A and FIG. 7B, all 26 samples of the embodied active devices $D_A$ pass the criteria established above of less than 20% (<20%) variation in threshold voltage (normalized) Vto and the current leakage of less than 1 mA/mm.

(3) Bias Highly Accelerated Temperature/Humidity Stress Test on Capacitors

The capacitors of the comparative examples (i.e. without any shielding structure; not shown) and the capacitors of the exemplary embodiments (i.e. with the shielding structure 40 as shown in FIG. 2E) are also subjected to a bias highly accelerated temperature/humidity stress test (bHAST), thereby evaluating how well the passive devices resists moisture ingression.

A total of 27 samples of the comparative capacitors and 78 samples of the embodied capacitors were selected for bHAST screening. The samples were mounted to a test board and biased at 8.0 volts. The biased samples were then subjected to a temperature of 130° C. with a relative humidity of 85% and pressurized to 2.27 atm for a duration of 96 hours. Capacitor leakage was measured prior to screening and at the completion of the 96 hours. The failure criterion of a leakage of more than 100 µA at 8V at the completion of the 96 hours was determined. According to the results, 4 samples in all 27 samples (i.e. 15%) of the comparative capacitors fail to pass the bHAST at the completion of the 96 hours, while all 78 samples of the embodied capacitors pass the criteria established above of less than 100 µA leakage at 8V.

Figure 8:
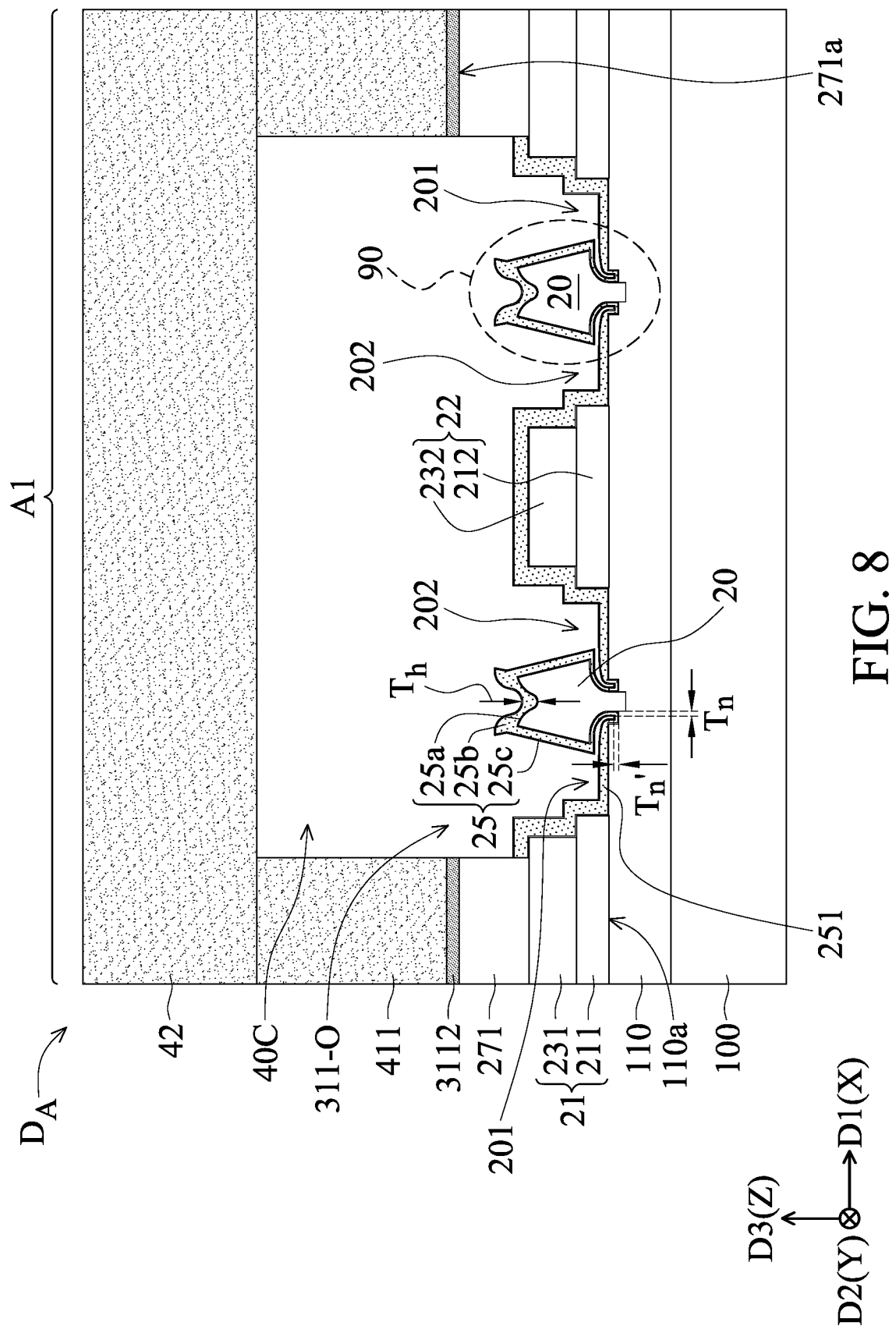
FIG. 8 is a cross-sectional view schematically illustrating a semiconductor structure in accordance with some embodiments.
Figure 9:
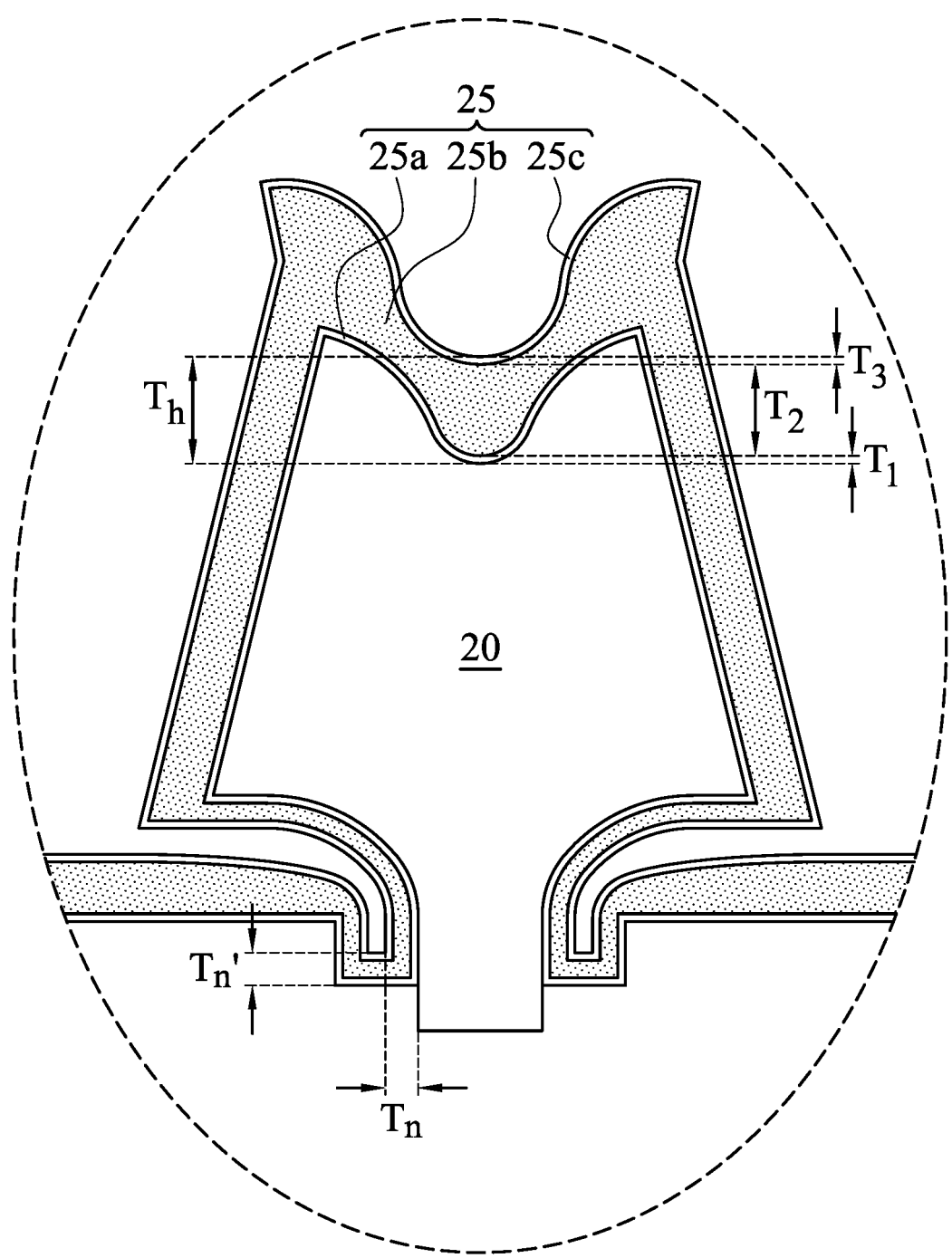
FIG. 9 is an enlarged view of the circled portion in FIG. 8.

FIG. 8 illustrates a semiconductor structure in accordance with some embodiments. FIG. 9 is an enlarged view of the circled portion 90 in FIG. 8. The difference between the embodiments illustrated by FIG. 8 and the embodiments illustrated by FIG. 5 is that the dielectric layer 25 of the embodiments illustrated by FIG. 8 includes a plurality of sub-layers. In some embodiments, as shown in FIG. 8 and FIG. 9, the dielectric layer 25 disposed on the active device $D_A$ includes a first sub-layer 25a, a second sub-layer 25b on the first sub-layer 25a, and a third sub-layer 25c on the second sub-layer 25b.

In some embodiments, the dielectric constant of the material of the second sub-layer 25b is less than the dielectric constant of the material of the first sub-layer 25a, and the thickness $T_2$ of the second sub-layer 25b is greater than the thickness $T_1$ of the first sub-layer 25a, as shown in FIG. 9. Therefore, the gate-to-source capacitance (CGS) and/or the gate-to-drain capacitance (CGD) may be reduced.

In some embodiments, the first sub-layer 25a is applied to improve the surface quality of the compound semiconductor epitaxial layer 110 (e.g., to reduce the dangling bonds on the top surface 110a of the compound semiconductor epitaxial layer 110). In some embodiments, since the thickness $T_1$ of the first sub-layer 25a is less than the thickness $T_2$ of the second sub-layer 25b, the surface quality of the compound semiconductor epitaxial layer 110 may be improved without significantly increasing the parasitic capacitance (e.g., CGS and CGD). The ratio of the thickness $T_2$ to the thickness $T_1$ may be greater than 1 (e.g., $1 < T_2/T_1 \leq 100$). In some embodiments, the ratio of the thickness $T_2$ to the thickness $T_1$ is in a range between 4 and 25. For example, the thickness $T_1$ may be in a range between 20 Å and 200 Å. For example, the thickness $T_2$ may be in a range between 200 Å and 2000 Å.

In some embodiments, the dielectric constant of the material of the second sub-layer 25b is less than the dielectric constant of the material of the third sub-layer 25c, and the thickness $T_2$ of the second sub-layer 25b is greater than the thickness $T_3$ of the third sub-layer 25c, as shown in FIG. 9. Therefore, the gate-to-source capacitance (CGS) and/or the gate-to-drain capacitance (CGD) may be reduced.

In some embodiments, the third sub-layer 25c is applied to improve the moisture resistance. In some embodiments, since the thickness $T_3$ of the third sub-layer 25c is less than the thickness $T_2$ of the second sub-layer 25b, the moisture resistance may be improved without significantly increasing the parasitic capacitance (e.g., CGS and CGD). The ratio of the thickness $T_2$ to the thickness $T_3$ may be greater than 1 (e.g., $1 < T_2/T_3 \leq 200$). In some embodiments, the ratio of the thickness $T_2$ to the thickness $T_3$ is in a range between 4 and 50. For example, the thickness $T_3$ may be in a range between 20 Å and 200 Å.

In some embodiments, the first sub-layer 25a is made of silicon nitride, the second sub-layer 25b is made of silicon oxide, and the third sub-layer 25c is made of silicon nitride. In some embodiments, as shown in FIG. 8 and FIG. 9, the dielectric layer 25 includes the thick sub-layer 25b sandwiched between the thin sub-layer 25a and the thin sub-layer 25c. Therefore, the parasitic capacitance may be reduced, and the surface quality of the compound semiconductor epitaxial layer 110 and the moisture resistance may be improved.

In some embodiments, the first sub-layer 25a, the second sub-layer 25b, and the third sub-layer 25c are formed by PECVD, ALD, another applicable method, or a combination thereof. In some embodiments, the second sub-layer 25b is formed by PECVD, and the thickness $T_n$ of the dielectric layer 25 on the neck portion of the gate electrode 20 is less than the thickness $T_h$ of the dielectric layer 25 on the head portion of the gate electrode 20. In some embodiments, since the thickness $T_n$ is less than the thickness $T_h$, the parasitic capacitance is further reduced. For example, the ratio of the thickness $T_n$ to the thickness $T_h$ may be in a range between 0.15 and 0.95.

In some embodiments, as shown in FIG. 8 and FIG. 9, the neck portion of the gate electrode 20 is located on a recess on the top of the compound semiconductor epitaxial layer 110. In some embodiments, the second sub-layer 25b is formed by PECVD, and the thickness $T_n'$ of the dielectric layer 25 in the recess on the compound semiconductor epitaxial layer 110 is less than the thickness $T_h$. In some embodiments, since the thickness $T_n'$ is less than the thickness $T_h$, the parasitic capacitance is further reduced. For example, the ratio of the thickness $T_n'$ to the thickness $T_h$ may be in a range between 0.15 and 0.95.

According to the aforementioned descriptions, a semiconductor structure is provided. The semiconductor structure includes one or more active devices and one or more passive devices over a substrate. The semiconductor structure further includes a passivation layer covering the top surface of the passive device(s), and the passivation layer has an opening that exposes the active device(s). In some embodiments, the opening of the passivation layer exposes the gate electrode, the drain structure and at least the sidewalls of the source structures of the active device. Therefore, the parasitic capacitances that are typically generated between the source/drain electrode (of the source/drain structures) and the gate electrode of the active device can be significantly reduced, and the electrical properties of the active device can be improved. In some embodiments, the remaining portion of the passivation layer covers the top surface of the passive device, so as to protect it from moisture. Additionally, the semiconductor structure may further include a shielding structure (e.g. containing the barrier portion as a barrier wall and the ceiling layer as a roof) having an air cavity in communication with the opening of the passivation layer. The shielding structure further protects the active devices against harmful contaminants such as moisture, humidity, particulates, or ionic impurities, thereby improving the reliability of the active devices. The shielding structure can be further formed over the passive device for enhancing the protection against the harmful contaminants described above. Also, according to the method for forming the semiconductor structure in some embodiments, the passivation layer can be selectively removed to expose the active devices using the barrier portion of the shielding structure as a mask. Thus, the method for forming the semiconductor structure in accordance with some embodiments provides a simple way for providing the active devices with improved electrical properties.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an active device disposed over the substrate and in a first region of the substrate;
a passive device disposed over the substrate and in a second region of the substrate;
a shielding structure comprising a barrier layer and a ceiling layer, the barrier layer is on the passive device and the active device, and the ceiling layer is on the barrier layer; and
a passivation layer under the barrier layer and covering a top surface of the passive device, wherein an air cavity is defined by sidewalls of the barrier layer, a bottom surface of the ceiling layer, and the substrate.

2. The semiconductor structure as claimed in claim 1, wherein the passivation layer further covers at least a portion of the active device.

3. The semiconductor structure as claimed in claim 1, wherein the active device comprises a gate electrode, a source structure, and a drain structure, the source structure and the drain structure are on opposite sides of the gate electrode, the gate electrode and the drain structure are in the air cavity.

4. The semiconductor structure as claimed in claim 3, wherein the source structure is under the barrier layer, and the passivation layer covers the source structure.

5. The semiconductor structure as claimed in claim 3, wherein the active device further comprises a compound semiconductor layer, and the semiconductor structure further comprising:
a dielectric layer covering the gate electrode and a top surface of the compound semiconductor layer.

6. The semiconductor structure as claimed in claim 5, wherein the dielectric layer further covers the drain structure.

7. The semiconductor structure as claimed in claim 5, wherein the dielectric layer comprises a first sub-layer, a second sub-layer on the first sub-layer, and a third sub-layer on the second sub-layer, and a thickness of the second sub-layer is greater than a thickness of the first sub-layer and the third sub-layer.

8. The semiconductor structure as claimed in claim 5, wherein the source structure comprising:
a first capping portion; and
a first conductive portion of a first conductive layer on the first capping portion,
wherein the dielectric layer further covers sidewalls of the first capping portion and sidewalls of the first conductive portion.

9. The semiconductor structure as claimed in claim 8, wherein the dielectric layer further covers a top surface of the first capping portion.

10. The semiconductor structure as claimed in claim 8, further comprising:
a second conductive layer disposed between the passivation layer and the first conductive portion of the first conductive layer.

11. The semiconductor structure as claimed in claim 10, wherein the dielectric layer further covers sidewalls of the second conductive layer and a top surface of the first conductive portion of the first conductive layer.

12. The semiconductor structure as claimed in claim 8, wherein the drain structure comprises:
a second capping portion; and
a second conductive portion of the first conductive layer on the second capping portion,
wherein the dielectric layer further covers the second capping portion and the second conductive portion.

13. The semiconductor structure as claimed in claim 3, wherein the gate electrode comprises a T-shaped body.

14. The semiconductor structure as claimed in claim 1, wherein the passive device is a capacitor comprising:
a first conductive part on the substrate;
a dielectric layer on the first conductive part; and
a second conductive part on the dielectric layer.

15. The semiconductor structure as claimed in claim 1, wherein the barrier layer and the ceiling layer comprise a same material.

16. The semiconductor structure as claimed in claim 1, wherein the shielding structure and the passivation layer comprise different materials.

17. The semiconductor structure as claimed in claim 1, wherein the shielding structure comprises a polymer material.

18. The semiconductor structure as claimed in claim 1, wherein the passivation layer comprises $Si_3N_4$, $SiO_2$, $SiO_xN_y$, AN, $Al_2O_3$, $HfO_2$, or a combination thereof.

19. The semiconductor structure as claimed in claim 1, wherein the active device comprises a high electron mobility transistor, a heterojunction bipolar transistor, or a combination thereof.

20. The semiconductor structure as claimed in claim 19, wherein the passive device comprises a capacitor.